United States Patent
Jung et al.

(10) Patent No.: US 6,190,837 B1
(45) Date of Patent: *Feb. 20, 2001

(54) METHOD FOR FORMING PHOTORESIST FILM PATTERN

(75) Inventors: Jae Chang Jung; Hyang Gi Kim, both of Ichon (KR)

(73) Assignee: Hyundai Electronics Industries Co., Ltd., Kyoungki-do (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/882,407

(22) Filed: Jun. 25, 1997

(30) Foreign Application Priority Data

Jun. 27, 1996  (KR) .................................................. 96-24261

(51) Int. Cl.[7] ........................................................ G03F 7/26
(52) U.S. Cl. ............................................. 430/315; 430/330
(58) Field of Search .................................... 430/311, 313, 430/315, 323, 324, 325, 330

(56) References Cited

U.S. PATENT DOCUMENTS

| 5,312,717 | * | 5/1994 | Sachdev | ................................ 430/313 |
| 5,384,220 | * | 1/1995 | Sezi | ........................................ 430/8 |

* cited by examiner

*Primary Examiner*—Kathleen Duda
(74) *Attorney, Agent, or Firm*—Nath & Associates; Gary M. Nath; Harold L. Novick

(57) ABSTRACT

A method for forming a fine pattern on a wafer substrate via a silylation process, by which one photoresist film can be used irrespective of light sources including KrF (248 nm) and ArF (193 nm) and a positive pattern with a positive pattern as small as 0.18 μm in size can be obtained.

12 Claims, 4 Drawing Sheets

METHOD FOR FORMING PHOTORESIST FILM PATTERN

BACKGROUND OF THE INVENTION

1. Field of the Invention

The present invention relates, in general, to a method for forming a photoresist film pattern on a wafer substrate by a lithography process and, more particularly, to the use of a silylation photoresist film in forming a fine pattern.

2. Description of the Prior Art

Necessary to form a pattern in a semiconductor device is a lithography process, which generally comprises coating a photoresist film on a layer to be patterned, exposing and developing the photoresist film through a patterned mask to form a photoresist film pattern, and etching the layer with the photoresist film pattern serving as a mask.

To produce 4 G or 16 G DRAM semiconductor devices, a fine pattern as small as 0.18 μm or less in size is required. However, the wet development process in current use has a difficultly in solving the problems of the breaking down of patterns and the allowance for the depth of focus on a practical topology. For this reason, a dry development process in combination with a silylation technique was developed and used in a masking process for 4 G and 16 G DRAM semiconductor devices.

In order to better understand the background of the invention, a description will be given of a conventional method for forming a photoresist film pattern through a silylation technique, in connection with some drawings.

First, a light beam is irradiated through a mask to a photoresist film 2 underlain by a layer 2 upon a semiconductor substrate 100, as shown in FIG. 1. The layer 2 is to be etched and consists of a photoresist material and a novolak resin.

FIG. 2 is a schematic view after the photoresist film 2 is subjected to a baking process, to make the irradiated regions 5 of the photoresist film 2 thermally cured whereas the regions which are not exposed to the light beam remain as they are.

FIG. 3 shows a silylation process in which a silylation agent, containing N—Si bond, such as hexamethyl disilazane or tetramethyldisilazane, is injected into the regions 5 exposed to the light beam. N—Si bond is so weak that it may be readily broken and react with R—O—H of the resin to form R—O—Si—(CH$_3$)$_3$ (trimethylsilicon).

FIG. 4 shows a dry developing process utilizing O$_2$ plasma, by which a silicon oxide 6 is formed in the trimethyl silicon bonded with the resin of the exposed regions whereas the unexposed regions of the photoresist film 2 are etched to form a photoresist film pattern 2'.

FIG. 5 is a schematic view after the layer 1 is etched to create a pattern 1', with the photoresist film pattern 2' serving as a mask.

As illustrated, this conventional method by which the exposed regions remain as a photoresist film pattern whereas the unexposed regions are removed, forms a pattern such as that of the general negative photoresist film.

The photoresist film pattern formed via the conventional silylation process is poor in profile because the boundaries between the exposed regions and the unexposed regions are not clear. In addition, light diffracts into the regions which are determined not to be exposed, generating a swelling phenomenon.

Typically, KrF (248 nm) or ArF (193 nm) is used as a light source. The photo acid compound (PAC) contained in the convention photoresist film depends on and varies with the light source.

SUMMARY OF THE INVENTION

Therefore, it is an objective of the present invention to overcome the above-mentioned problems encountered in prior arts and to provide a method for forming a fine pattern on a wafer substrate though a silylation process, by which one photoresist film can be used irrespective of light sources including KrF (248 nm) and ArF (193 nm) and a positive pattern with a positive pattern as small as 0.18 μm in size can be obtained.

In accordance with the present invention, there is provided a method for forming a fine photoresist film pattern, comprising the steps of: coating a photoresist film on a layer to be etched and exposing a certain depth of the photoresist film through a mask to a light beam, said photoresist film comprising a resin, a photoacid generator and a base; subjecting the photoresist film to post-exposure bake, to remove the base of the exposed region through the reaction of acid and base; silylating the photoresist film with a material containing H—Si bond, to create a Si—O-resin bond in the unexposed region with the aid of a catalytic action of the base which remains therein but no Si—O-resin bond in the exposed region; and etching the exposed region of the photoresist film by use of O$_2$ plasma, said Si—O-resin contained in the unexposed region of the photoresist film combining with oxygen to form a silicon oxide which serves as an etch barrier.

Brief Description of the Drawings

Other objects and aspects of the invention will become apparent from the following description of embodiments with reference to the accompanying drawings in which.

DETAILED DESCRIPTION OF THE PREFERRED EMBODIMENT

Figure 1:
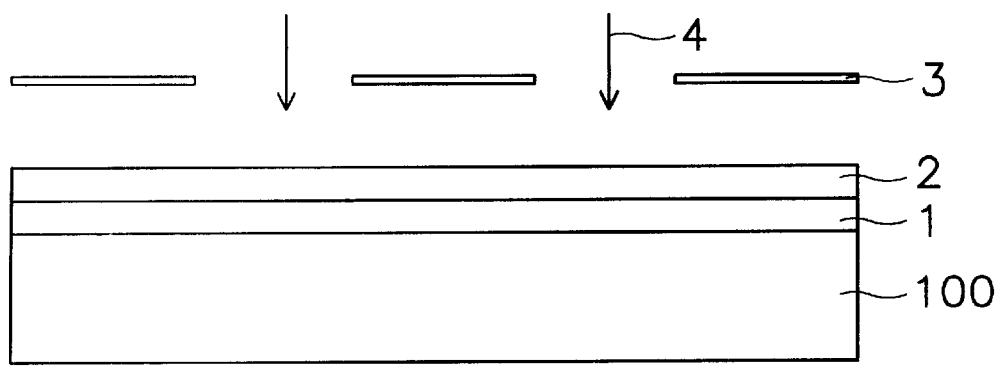
FIGS. 1 through 5 are schematic cross-sectional views illustrating a conventional method for forming a photoresist film pattern via a silylation process.
Figure 2:
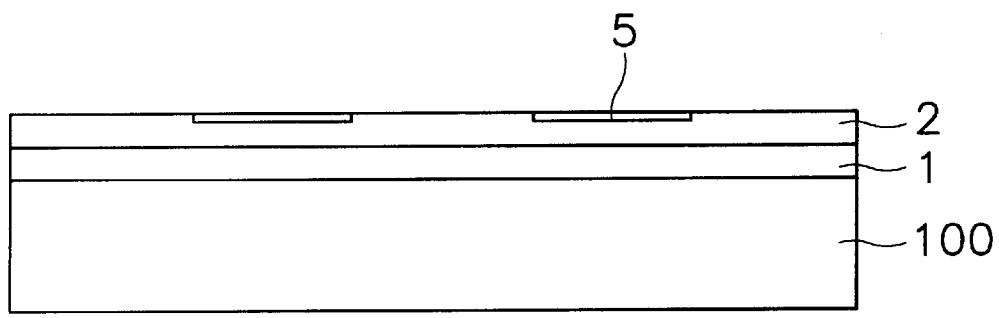
Figure 3:
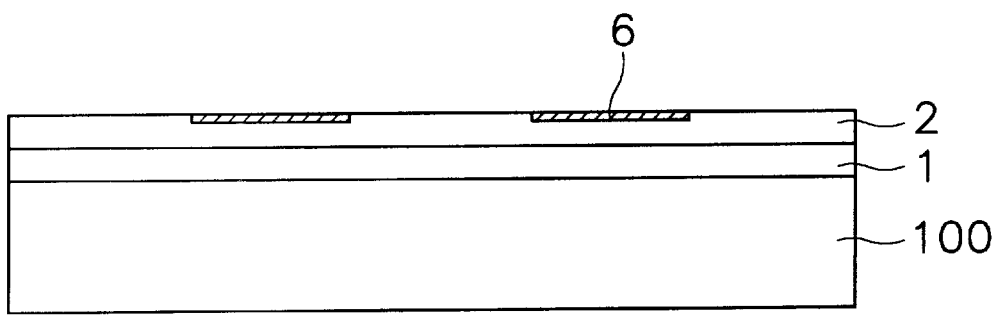
Figure 4:
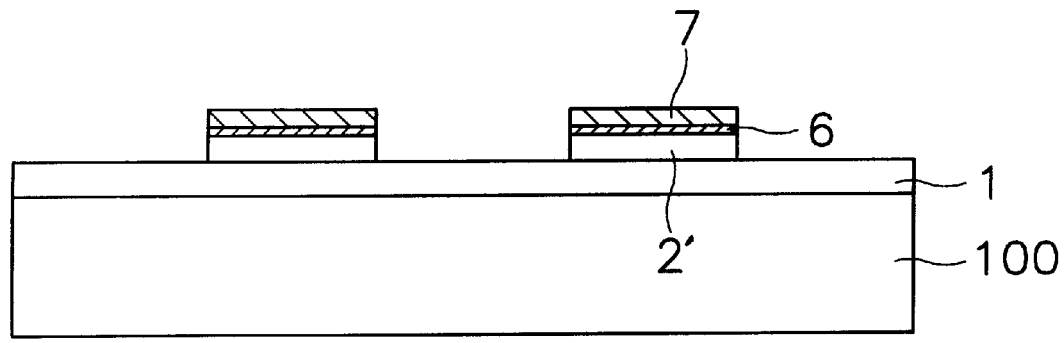
Figure 5:
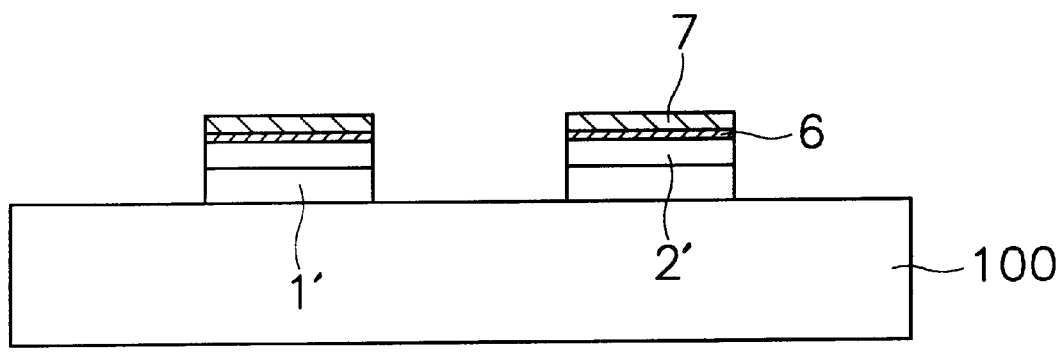

The application of the preferred embodiments of the present invention is best understood with reference to the accompanying drawings, wherein like reference numerals are used for like and corresponding parts, respectively.

Referring to FIGS. 6 to 9, there are stepwise illustrated the processes of forming a silylation photoresist film pattern, in accordance with the present invention.

Figure 6:
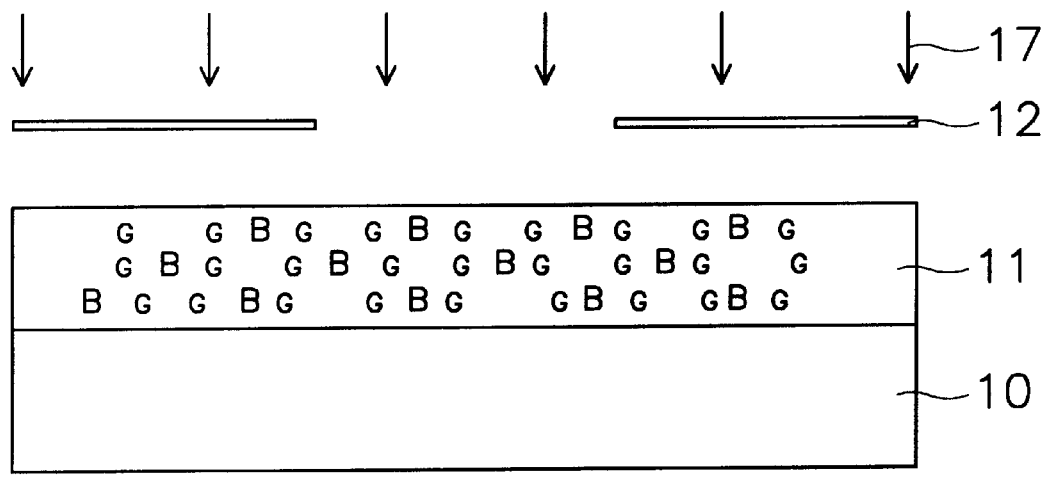
FIGS. 6 through 9 are schematic cross-sectional views illustrating a method for forming a photoresist film pattern via a silylation process, according to the present invention.

First, a photoresist film 11 which comprises a resin, a photoacid generator and a base, is coated upon a layer 10 to be etched and is exposed through a mask 12 to a light beam 17 from a light source, such as KrF (248 nm) and ArF (193 nm), as shown in FIG. 6.

The resin is a kind of novolak while the base is selected from the group consisting of aliphatic amines, hydroxides and alkoxides. In the photoresist film, the photoacid generator and the base are present in an equivalent ratio ranging from 90:10 to 51:49. In the figures, character "A" stands for acid, character "B" for base and character "G" for photoacid generator.

Figure 7:
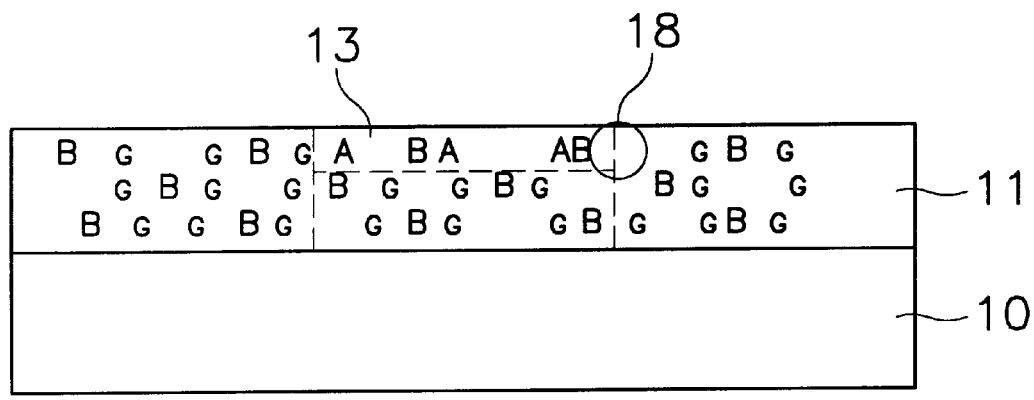

FIG. 7 is a schematic view after a post-exposure baking process is carried out at a temperature of, for example, 60–200° C. Because the novolak resin absorbs both KrF (248 nm) and ArF (193 nm) light beams, only the upper portions of the photoresist film are exposed. The baking process makes the photoacid generator of an exposed region 13 generate acids (A). Thus, the acids (A) generated combine with neighboring bases (B), so that no bases are in the exposed region 13.

Figure 8:
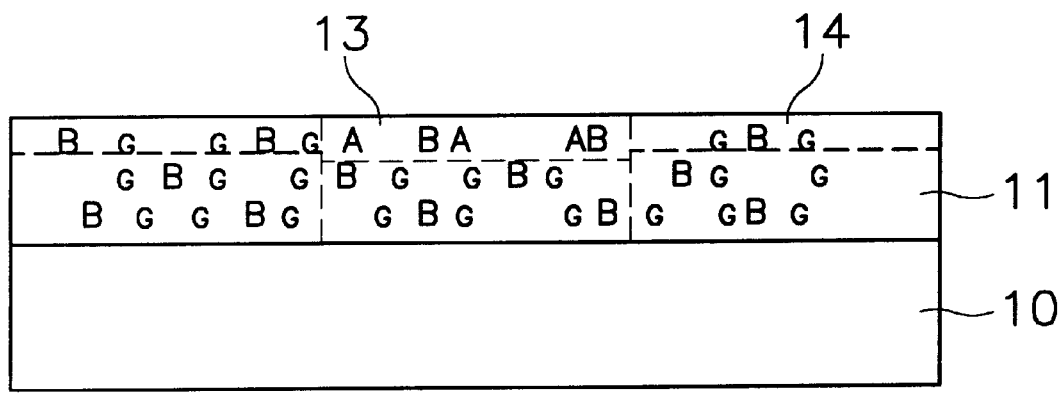

FIG. 8 is a schematic view after a silylation process is carried out by use of a material containing an H—Si bond. As a result of the silylation, Si—O-resin bond is formed in an unexposed region 14 because the bases (B) play the role of a catalyst in forming the bond whereas non Si—O-resin bond is in the exposed region 13 because of the absence of bases therein. When forming the Si—O-resin bond, hydrogen gas occurs, facilitating silylation material's diffusing in the resin even into the exposed region. As a result, silylation occurs in the unexposed region 14.

Optionally, a subsequent baking process at a temperature of 60–200° C. enables the silylation material diffused into the exposed region to evaporate out of the photoresist film 11. The reason is that the Si—H bond which the silylation material contains is so stable that it does not react with the hydroxy of the resin in the absence of a base catalyst.

For the silylation material, one is selected from the group consisting of dimethylphenylsilane, diphenylmethylsilane, triethylsilane, 1,1,3,3-tetramethyldisiloxane, triethoxysilane, trimethoxylsilane, trimethylsilane and the combinations thereof.

Figure 9:
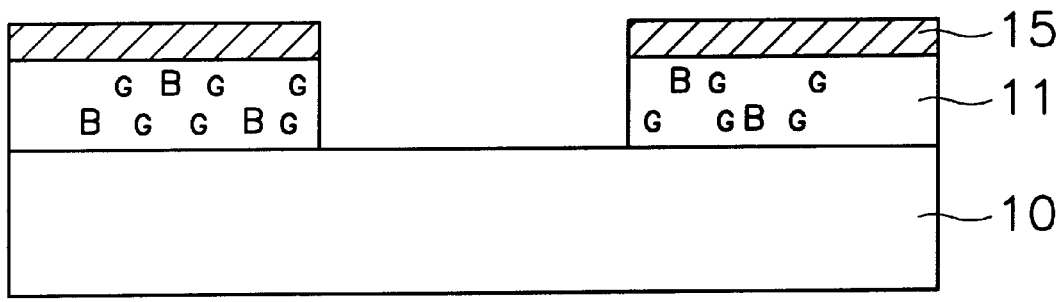

Using $O_2$ plasma, a dry development process is applied to etch out the exposed region 13 and a region of the photoresist film below, as shown in FIG. 9. In contrast, the photoresist film 11 of the unexposed region remains, forming a pattern because the silylation material in the surface of the unexposed region 14 reacts with the oxygen of the $O_2$ plasma to form a silicon oxide 15 which serves as an etch barrier.

Thereafter, the layer 10 is etched with the photoresist film pattern serving as a mask.

The silylation photoresist film useful for the present invention is prepared as follows: to a mixture of tetramethyldisiloxane ($H(CH_3)_2Si$—O—$Si(CH_3)_2H$) and bisphenol A (OH—$C_6H_4$—$C(CH_3)_2$—$C_6H_4$—OH), triethylamine is added to produce dibisphenoxytetramethyldisiloxane represented by the following formula, generating hydrogen gas.

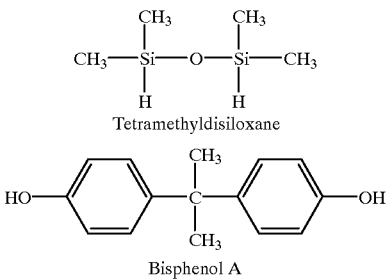

Tetramethyldisiloxane

Bisphenol A

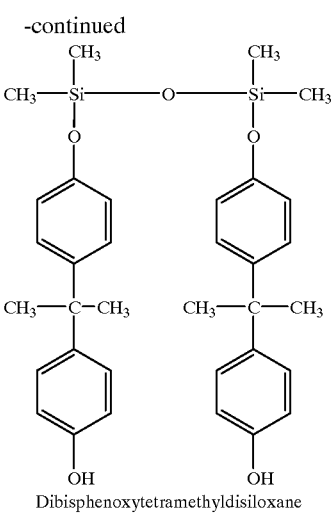

Dibisphenoxytetramethyldisiloxane

As previously described, the bond between the resin and the hydroxy requires the catalytic action of the base, which means that there is a great difference in the degree of silylation between the exposed region and unexposed region. Also, because such a great difference results in an increase of contrast, a pattern for a highly integrated circuit, such as 4 G or 16 G DRAM, can be obtained by the method according to the present invention. A buffer region between the exposed region abundant in acid and the unexposed region abundant in base serves to compensate a reduction effect of the contrast, attributed to the diffusion of acid or base.

Irrespective of light sources including KrF (248 nm) and ArF (193 nm), one kind of photoresist film can be used according to the present invention. In addition, because the photoresist film of the exposed region is removed, the same photoresist film pattern with a positive pattern can be obtained. Consequently, the method of the invention forms a fine pattern as small as 0.18 μm in size, contributing to the high integration of semiconductor devices.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for forming a fine photoresist film pattern, comprising the steps of:
   coating a photoresist film on a layer to be etched and exposing a certain depth of the photoresist film through a mask to a light beam, said photoresist film comprising a resin, a photoacid generator and base;
   subjecting the photoresist film to post-exposure bake, to remove the base in the exposed region through the reaction of acid and base;
   silylating the photoresist film with a material containing a H—Si bond, to create a Si—O-resin bond in the unexposed region with the aid of a catalytic action of the base which remains therein but no Si—O-resin bond in the exposed region; and
   etching the exposed region of the photoresist film by use of plasma, said Si—O-resin contained in the unexposed region of the photoresist film combined with oxygen to form a silicon oxide which serves as an etch barrier.

2. A method in accordance with claim 1, wherein said light beam is selected from the group consisting of KrF (248 nm) and ArF (193 nm).

3. A method in accordance with claim 1, wherein said resin is novolak.

4. A method in accordance with claim 1, wherein said photoacid generator and said base are present in equivalent weight ratio ranging from 90:10 to 51:49.

5. A method in accordance with claim 1, wherein said base is selected from the group consisting of aliphatic amines, hydroxides and alkoxides.

6. A method in accordance with claim 1, wherein said post-exposure bake process is carried out at a temperature of 60–200° C.

7. A method in accordance with claim 1, wherein said H—Si bond-containing material is selected from the group consisting of dimethylphenylsilane, diphenylmethylsilane, triethylsilane, 1,1,3,3-tetramethyldisiloxane, triethoxysilane, trimethoxylsilane, trimethylsilane and the combinations thereof.

8. A method for forming a fine photoresist film pattern, comprising the steps of:

coating a photoresist film on a layer to be etched;

exposing a certain depth of the photoresist film through a mask to a light beam, said photoresist film comprising a resin, a photoacid generator and a base which is selected from the group consisting of aliphatic amines, hydroxides and alkoxides;

subjecting the photoresist film to post-exposure bake, to remove the base in the exposed region through the reaction of acid and base;

silylating the photoresist film with a material containing a H—Si bond, to create a Si—O-resin bond in the unexposed region with the aid of a catalytic action of the base which remains therein but no Si—O-resin bond in the exposed region; and etching the exposed region of the photoresist film by use of O2 plasma, said Si—O-resin bond contained in the unexposed region of the photoresist film combined with oxygen to form a silicon oxide which serves as an etch barrier.

9. A method in accordance with claim 8, wherein said light beam is selected from the group consisting of KrF (248 nm) and ArF (193 nm).

10. A method in accordance with claim 8, wherein said resin in novolak.

11. A method in accordance with claim 8, wherein said photoacid generator and said base are present in a equivalent weight ratio ranging from 90:10 to 51:49.

12. A method in accordance with claim 8, wherein said H—Si bond-containing material is selected from the group consisting of dimethylphenylasilane, diphenylmethylsilane, triethylsilane, 1,1,3,3-tetramethyldisiloxane, triethoxysilane, trimethoxylsilane, trimethylsilane and combinations thereof.

* * * * *